(12) United States Patent
Kavalieros et al.

(10) Patent No.: US 7,479,421 B2
(45) Date of Patent: Jan. 20, 2009

(54) PROCESS FOR INTEGRATING PLANAR AND NON-PLANAR CMOS TRANSISTORS ON A BULK SUBSTRATE AND ARTICLE MADE THEREBY

(75) Inventors: Jack T. Kavalieros, Portland, OR (US); Justin K. Brask, Portland, OR (US); Brian S. Doyle, Portland, OR (US); Uday Shah, Portland, OR (US); Suman Datta, Beaverton, OR (US); Mark L. Doczy, Beaverton, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 35 days.

(21) Appl. No.: 11/238,444

(22) Filed: Sep. 28, 2005

(65) Prior Publication Data

US 2007/0069293 A1 Mar. 29, 2007

(51) Int. Cl.
*H01L 21/8234* (2006.01)
(52) U.S. Cl. .................. 438/197; 438/268; 438/275; 257/E21.421
(58) Field of Classification Search ............... 438/197, 438/268, 275, 288; 257/288, 368, E21.421
See application file for complete search history.

(56) References Cited

U.S. PATENT DOCUMENTS

| 4,487,652 A | 12/1984 | Almgren |
| 4,818,715 A | 4/1989 | Chao |
| 4,906,589 A | 3/1990 | Chao |
| 4,907,048 A | 3/1990 | Huang |
| 4,994,873 A | 2/1991 | Madan |
| 4,996,574 A | 2/1991 | Shirasaki |
| 5,124,777 A | 6/1992 | Lee |
| 5,179,037 A | 1/1993 | Seabaugh |
| 5,216,271 A | 6/1993 | Takagi et al. |
| 5,338,959 A | 8/1994 | Kim et al. |
| 5,346,836 A | 9/1994 | Manning et al. |
| 5,346,839 A | 9/1994 | Sundaresan |
| 5,357,119 A | 10/1994 | Wang et al. |
| 5,391,506 A | 2/1995 | Tada et al. |

(Continued)

FOREIGN PATENT DOCUMENTS

DE    10203998    8/2003

(Continued)

OTHER PUBLICATIONS

Park, T., et al., "Fabrication of Body-Tied FinFETs (Omega MOSFETs) Using Bulk Si Wafers," Symposium on VLSI Technology Digest of Technical Papers, Jun. 2003, 2 pgs.

(Continued)

*Primary Examiner*—Tuan N. Quach
(74) *Attorney, Agent, or Firm*—Blakely, Sokoloff, Taylor & Zafman LLP (57) ABSTRACT

A process capable of integrating both planar and non-planar transistors onto a bulk semiconductor substrate, wherein the channel of all transistors is definable over a continuous range of widths.

2 Claims, 5 Drawing Sheets

U.S. PATENT DOCUMENTS

| | | | |
|---|---|---|---|
| 5,466,621 A | 11/1995 | Hisamoto et al. |
| 5,475,869 A | 12/1995 | Gomi et al. |
| 5,479,033 A | 12/1995 | Baca et al. |
| 5,521,859 A | 5/1996 | Ema et al. |
| 5,543,351 A | 8/1996 | Hirai et al. |
| 5,545,586 A | 8/1996 | Koh |
| 5,563,077 A | 10/1996 | Ha |
| 5,578,513 A | 11/1996 | Maegawa |
| 5,652,454 A | 7/1997 | Iwamatsu et al. |
| 5,658,806 A | 8/1997 | Lin et al. |
| 5,665,203 A | 9/1997 | Lee et al. |
| 5,682,048 A | 10/1997 | Shinohara et al. |
| 5,698,869 A | 12/1997 | Yoshimi et al. |
| 5,701,016 A | 12/1997 | Burroughes et al. |
| 5,716,879 A | 2/1998 | Choi et al. |
| 5,739,544 A | 4/1998 | Yuki et al. |
| 5,770,513 A | 6/1998 | Okaniwa et al. |
| 5,776,821 A | 7/1998 | Haskell et al. |
| 5,793,088 A | 8/1998 | Choi et al. |
| 5,804,848 A | 9/1998 | Mukai |
| 5,814,895 A | 9/1998 | Hirayama et al. |
| 5,821,629 A | 10/1998 | Wen et al. |
| 5,827,769 A | 10/1998 | Aminzadeh et al. |
| 5,844,278 A | 12/1998 | Mizuno et al. |
| 5,880,015 A | 3/1999 | Hata |
| 5,888,309 A | 3/1999 | Yu |
| 5,889,304 A | 3/1999 | Watanabe |
| 5,899,710 A | 5/1999 | Mukai |
| 5,905,285 A | 5/1999 | Gardner et al. |
| 5,908,313 A | 6/1999 | Chau et al. |
| 5,952,701 A | 9/1999 | Bulucea et al. |
| 5,976,767 A | 11/1999 | Li |
| 6,013,926 A | 1/2000 | Oku et al. |
| 6,018,176 A | 1/2000 | Lim |
| 6,031,249 A | 2/2000 | Yamazaki et al. |
| 6,054,355 A | 4/2000 | Inumiya et al. |
| 6,066,869 A | 5/2000 | Noble et al. |
| 6,087,208 A | 7/2000 | Krivokapic et al. |
| 6,093,621 A | 7/2000 | Tseng |
| 6,114,201 A | 9/2000 | Wu |
| 6,117,741 A | 9/2000 | Chatterjee et al. |
| 6,120,846 A | 9/2000 | Hintermaier et al. |
| 6,144,072 A | 11/2000 | Iwamatsu et al. |
| 6,150,222 A | 11/2000 | Gardner et al. |
| 6,153,485 A | 11/2000 | Pey et al. |
| 6,163,053 A | 12/2000 | Kawashima |
| 6,165,880 A | 12/2000 | Yaung et al. |
| 6,174,820 B1 | 1/2001 | Habermehl et al. |
| 6,190,975 B1 | 2/2001 | Kubo et al. |
| 6,218,309 B1 | 4/2001 | Miller et al. |
| 6,251,729 B1 | 6/2001 | Montree et al. |
| 6,251,763 B1 | 6/2001 | Inumiya et al. |
| 6,252,284 B1 | 6/2001 | Muller et al. |
| 6,259,135 B1 | 7/2001 | Hsu et al. |
| 6,261,921 B1 | 7/2001 | Yen et al. |
| 6,274,503 B1 | 8/2001 | Hsieh |
| 6,287,924 B1 | 9/2001 | Chao et al. |
| 6,294,416 B1 | 9/2001 | Wu |
| 6,307,235 B1 | 10/2001 | Forbes et al. |
| 6,310,367 B1 | 10/2001 | Yagishita et al. |
| 6,335,251 B2 | 1/2002 | Miyano et al. |
| 6,359,311 B1 | 3/2002 | Colinge et al. |
| 6,362,111 B1 | 3/2002 | Laaksonen et al. |
| 6,368,923 B1 | 4/2002 | Huang |
| 6,376,317 B1 | 4/2002 | Forbes et al. |
| 6,383,882 B1 | 5/2002 | Lee et al. |
| 6,387,820 B1 | 5/2002 | Sanderfer |
| 6,391,782 B1 | 5/2002 | Yu |
| 6,396,108 B1 | 5/2002 | Krivokapic et al. |
| 6,399,970 B2 | 6/2002 | Kubo et al. |
| 6,403,434 B1 | 6/2002 | Yu |
| 6,403,981 B1 | 6/2002 | Yu |
| 6,407,442 B2 | 6/2002 | Inoue et al. |
| 6,413,802 B1 | 7/2002 | Hu et al. |
| 6,413,877 B1 | 7/2002 | Annapragada |
| 6,424,015 B1 | 7/2002 | Ishibashi et al. |
| 6,437,550 B2 | 8/2002 | Andoh et al. |
| 6,457,890 B1 | 10/2002 | Kohlruss et al. |
| 6,458,662 B1 | 10/2002 | Yu |
| 6,459,123 B1 | 10/2002 | Enders et al. |
| 6,472,258 B1 | 10/2002 | Adkisson et al. |
| 6,475,869 B1 | 11/2002 | Yu |
| 6,475,890 B1 | 11/2002 | Yu |
| 6,483,146 B2 | 11/2002 | Lee et al. |
| 6,483,156 B1 | 11/2002 | Adkisson et al. |
| 6,498,096 B2 | 12/2002 | Bruce et al. |
| 6,500,767 B2 | 12/2002 | Chiou et al. |
| 6,501,141 B1 | 12/2002 | Leu |
| 6,506,692 B2 | 1/2003 | Andideh |
| 6,525,403 B2 | 2/2003 | Inaba et al. |
| 6,534,807 B2 | 3/2003 | Mandelman et al. |
| 6,537,885 B1 | 3/2003 | Kang et al. |
| 6,555,879 B1 | 4/2003 | Krivokapic et al. |
| 6,562,665 B1 | 5/2003 | Yu |
| 6,583,469 B1 | 6/2003 | Fried et al. |
| 6,605,498 B1 | 8/2003 | Murthy et al. |
| 6,610,576 B2 | 8/2003 | Nowak |
| 6,611,029 B1 | 8/2003 | Ahmed et al. |
| 6,630,388 B2 | 10/2003 | Sekigawa et al. |
| 6,635,909 B2 | 10/2003 | Clark et al. |
| 6,642,090 B1 | 11/2003 | Fried et al. |
| 6,642,114 B2 | 11/2003 | Nakamura |
| 6,645,797 B1 | 11/2003 | Buynoski et al. |
| 6,645,826 B2 | 11/2003 | Yamazaki et al. |
| 6,656,853 B2 | 12/2003 | Ito |
| 6,657,259 B2 | 12/2003 | Fried et al. |
| 6,664,160 B2 | 12/2003 | Park et al. |
| 6,680,240 B1 | 1/2004 | Maszara |
| 6,686,231 B1 | 2/2004 | Ahmed et al. |
| 6,689,650 B2 | 2/2004 | Gambino et al. |
| 6,693,324 B2 | 2/2004 | Maegawa et al. |
| 6,696,366 B1 | 2/2004 | Morey et al. |
| 6,706,571 B1 | 3/2004 | Yu et al. |
| 6,709,982 B1 | 3/2004 | Buynoski et al. |
| 6,713,396 B2 | 3/2004 | Anthony |
| 6,716,684 B1 | 4/2004 | Krivokapic et al. |
| 6,716,686 B1 | 4/2004 | Buynoski et al. |
| 6,716,690 B1 | 4/2004 | Wang et al. |
| 6,730,964 B2 | 5/2004 | Horiuchi |
| 6,744,103 B2 | 6/2004 | Snyder |
| 6,756,657 B1 | 6/2004 | Zhang et al. |
| 6,762,469 B2 | 7/2004 | Mocuta et al. |
| 6,764,884 B1 | 7/2004 | Yu et al. |
| 6,770,516 B2 | 8/2004 | Wu et al. |
| 6,774,390 B2 | 8/2004 | Sugiyama et al. |
| 6,787,402 B1 | 9/2004 | Yu |
| 6,787,439 B2 | 9/2004 | Ahmed et al. |
| 6,787,845 B2 | 9/2004 | Deleonibus |
| 6,787,854 B1 | 9/2004 | Yang et al. |
| 6,790,733 B1 | 9/2004 | Natzle et al. |
| 6,794,313 B1 | 9/2004 | Chang |
| 6,794,718 B2 | 9/2004 | Nowak et al. |
| 6,798,000 B2 | 9/2004 | Luyken et al. |
| 6,800,885 B1 | 10/2004 | An et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,812,111 B2 | 11/2004 | Cheong et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,835,618 B1 | 12/2004 | Dakshina-Murthy et al. |
| 6,838,322 B2 | 1/2005 | Pham et al. |

| | | |
|---|---|---|
| 6,844,238 B2 | 1/2005 | Yeo et al. |
| 6,849,556 B2 | 2/2005 | Takahashi |
| 6,849,884 B2 | 2/2005 | Clark et al. |
| 6,852,559 B2 | 2/2005 | Kwak et al. |
| 6,855,606 B2 | 2/2005 | Chen et al. |
| 6,855,990 B2 | 2/2005 | Yeo et al. |
| 6,858,478 B2 | 2/2005 | Chau et al. |
| 6,867,433 B2 | 3/2005 | Yeo et al. |
| 6,867,460 B1 | 3/2005 | Anderson et al. |
| 6,869,898 B2 | 3/2005 | Inaki et al. |
| 6,884,154 B2 | 4/2005 | Mizushima et al. |
| 6,885,055 B2 | 4/2005 | Lee |
| 6,891,234 B1 | 5/2005 | Connelly et al. |
| 6,897,527 B2 | 5/2005 | Dakshina-Murthy et al. |
| 6,902,962 B2 | 6/2005 | Yeo et al. |
| 6,909,151 B2 | 6/2005 | Hareland et al. |
| 6,921,691 B1 | 7/2005 | Li et al. |
| 6,921,963 B2 | 7/2005 | Krivokapic et al. |
| 6,921,982 B2 | 7/2005 | Joshi et al. |
| 6,924,190 B2 | 8/2005 | Dennison |
| 6,960,517 B2 | 11/2005 | Rios et al. |
| 6,967,351 B2 * | 11/2005 | Fried et al. .................. 257/74 |
| 6,974,738 B2 | 12/2005 | Hareland |
| 7,018,551 B2 | 3/2006 | Beintner et al. |
| 7,045,401 B2 | 5/2006 | Lee et al. |
| 7,045,441 B2 | 5/2006 | Chang et al. |
| 7,060,539 B2 | 6/2006 | Chidambarrao et al. |
| 7,061,055 B2 | 6/2006 | Sekigawa et al. |
| 7,071,064 B2 | 7/2006 | Doyle et al. |
| 7,074,623 B2 | 7/2006 | Lochtefeld et al. |
| 7,105,390 B2 * | 9/2006 | Brask et al. .................. 438/149 |
| 7,105,891 B2 | 9/2006 | Visokay et al. |
| 7,105,894 B2 * | 9/2006 | Yeo et al. .................. 257/349 |
| 7,112,478 B2 | 9/2006 | Grupp et al. |
| 7,119,402 B2 | 10/2006 | Kinoshita et al. |
| 7,122,463 B2 | 10/2006 | Ohuchi |
| 7,141,856 B2 | 11/2006 | Lee et al. |
| 7,154,118 B2 * | 12/2006 | Lindert et al. .................. 257/66 |
| 7,163,851 B2 | 1/2007 | Adadeer et al. |
| 7,183,137 B2 | 2/2007 | Lee et al. |
| 7,187,043 B2 | 3/2007 | Arai et al. |
| 7,238,564 B2 | 7/2007 | Ko et al. |
| 7,241,653 B2 | 7/2007 | Hareland et al. |
| 7,250,645 B1 | 7/2007 | Wang et al. |
| 7,291,886 B2 | 11/2007 | Doris et al. |
| 2001/0019886 A1 | 9/2001 | Bruce et al. |
| 2001/0040907 A1 | 11/2001 | Chakrabarti |
| 2002/0011612 A1 | 1/2002 | Hieda |
| 2002/0036290 A1 | 3/2002 | Inaba et al. |
| 2002/0058374 A1 | 5/2002 | Kim et al. |
| 2002/0074614 A1 | 6/2002 | Furuta et al. |
| 2002/0081794 A1 | 6/2002 | Ito |
| 2002/0096724 A1 | 7/2002 | Liang et al. |
| 2002/0160553 A1 | 10/2002 | Yamanaka et al. |
| 2002/0166838 A1 | 11/2002 | Nagarajan |
| 2002/0167007 A1 | 11/2002 | Yamazaki et al. |
| 2003/0042542 A1 | 3/2003 | Maegawa et al. |
| 2003/0057477 A1 | 3/2003 | Hergenrother et al. |
| 2003/0057486 A1 | 3/2003 | Gambino et al. |
| 2003/0067017 A1 | 4/2003 | Ieong et al. |
| 2003/0085194 A1 | 5/2003 | Hopkins, Jr. |
| 2003/0098488 A1 | 5/2003 | O'Keeffe et al. |
| 2003/0102497 A1 | 6/2003 | Fried et al. |
| 2003/0102518 A1 | 6/2003 | Fried et al. |
| 2003/0111686 A1 | 6/2003 | Nowak |
| 2003/0122186 A1 | 7/2003 | Sekigawa et al. |
| 2003/0143791 A1 | 7/2003 | Cheong et al. |
| 2003/0151077 A1 | 8/2003 | Mathew et al. |
| 2003/0174534 A1 | 9/2003 | Clark et al. |
| 2003/0201458 A1 | 10/2003 | Clark et al. |
| 2003/0227036 A1 | 12/2003 | Sugiyama et al. |
| 2004/0031979 A1 | 2/2004 | Lochtefeld et al. |
| 2004/0033639 A1 | 2/2004 | Chinn et al. |
| 2004/0036118 A1 | 2/2004 | Adadeer et al. |
| 2004/0036126 A1 | 2/2004 | Chau et al. |
| 2004/0036127 A1 | 2/2004 | Chau et al. |
| 2004/0038533 A1 | 2/2004 | Liang |
| 2004/0061178 A1 | 4/2004 | Lin et al. |
| 2004/0070020 A1 | 4/2004 | Fujiwara et al. |
| 2004/0075149 A1 | 4/2004 | Fitzgerald et al. |
| 2004/0082125 A1 | 4/2004 | Hou |
| 2004/0092062 A1 | 5/2004 | Ahmed et al. |
| 2004/0092067 A1 | 5/2004 | Hanafi et al. |
| 2004/0094807 A1 | 5/2004 | Chau et al. |
| 2004/0099966 A1 | 5/2004 | Chau et al. |
| 2004/0108523 A1 | 6/2004 | Chen et al. |
| 2004/0110097 A1 | 6/2004 | Ahmed et al. |
| 2004/0119100 A1 | 6/2004 | Nowak et al. |
| 2004/0126975 A1 | 7/2004 | Ahmed et al. |
| 2004/0132236 A1 | 7/2004 | Doris |
| 2004/0145000 A1 | 7/2004 | An et al. |
| 2004/0145019 A1 | 7/2004 | Dakshina-Murthy et al. |
| 2004/0166642 A1 | 8/2004 | Chen et al. |
| 2004/0180491 A1 | 9/2004 | Arai et al. |
| 2004/0191980 A1 | 9/2004 | Rios et al. |
| 2004/0195624 A1 | 10/2004 | Liu et al. |
| 2004/0198003 A1 | 10/2004 | Yeo et al. |
| 2004/0203254 A1 | 10/2004 | Conley et al. |
| 2004/0219722 A1 | 11/2004 | Pham et al. |
| 2004/0219780 A1 | 11/2004 | Ohuchi |
| 2004/0222473 A1 | 11/2004 | Risaki |
| 2004/0227187 A1 | 11/2004 | Cheng et al. |
| 2004/0238887 A1 | 12/2004 | Nihey |
| 2004/0238915 A1 | 12/2004 | Chen et al. |
| 2004/0256647 A1 | 12/2004 | Lee et al. |
| 2004/0262683 A1 | 12/2004 | Bohr et al. |
| 2004/0262699 A1 | 12/2004 | Rios et al. |
| 2005/0019993 A1 | 1/2005 | Lee et al. |
| 2005/0035415 A1 | 2/2005 | Yeo et al. |
| 2005/0059214 A1 * | 3/2005 | Cheng et al. .................. 438/270 |
| 2005/0093067 A1 | 5/2005 | Yeo et al. |
| 2005/0093075 A1 | 5/2005 | Bentum et al. |
| 2005/0093154 A1 | 5/2005 | Kottantharayil et al. |
| 2005/0104055 A1 | 5/2005 | Kwak et al. |
| 2005/0110082 A1 | 5/2005 | Cheng |
| 2005/0118790 A1 | 6/2005 | Lee et al. |
| 2005/0127362 A1 | 6/2005 | Zhang et al. |
| 2005/0127632 A1 | 6/2005 | Gehret |
| 2005/0139860 A1 | 6/2005 | Synder et al. |
| 2005/0145894 A1 | 7/2005 | Chau et al. |
| 2005/0145941 A1 | 7/2005 | Bedell et al. |
| 2005/0145944 A1 | 7/2005 | Murthy et al. |
| 2005/0148131 A1 | 7/2005 | Brask |
| 2005/0156171 A1 | 7/2005 | Brask et al. |
| 2005/0156202 A1 | 7/2005 | Rhee et al. |
| 2005/0156227 A1 | 7/2005 | Jeng |
| 2005/0161739 A1 | 7/2005 | Anderson et al. |
| 2005/0167766 A1 | 8/2005 | Yagishita |
| 2005/0170593 A1 | 8/2005 | Kang et al. |
| 2005/0184316 A1 | 8/2005 | Kim |
| 2005/0199919 A1 | 9/2005 | Liu et al. |
| 2005/0215014 A1 | 9/2005 | Ahn et al. |
| 2005/0215022 A1 | 9/2005 | Adam et al. |
| 2005/0224797 A1 | 10/2005 | Ko et al. |
| 2005/0224800 A1 | 10/2005 | Lindert et al. |
| 2005/0227498 A1 | 10/2005 | Furkawa |
| 2005/0230763 A1 | 10/2005 | Huang et al. |
| 2005/0233156 A1 | 10/2005 | Senzaki |
| 2005/0239252 A1 * | 10/2005 | Ahn et al. .................. 438/268 |
| 2005/0255642 A1 | 11/2005 | Liu et al. |
| 2005/0272192 A1 | 12/2005 | Oh et al. |
| 2005/0277294 A1 | 12/2005 | Schaefer et al. |
| 2005/0280121 A1 | 12/2005 | Doris et al. |
| 2006/0014338 A1 | 1/2006 | Doris et al. |
| 2006/0040054 A1 | 2/2006 | Pearlstein et al. |
| 2006/0046521 A1 | 3/2006 | Vaartstra et al. |

| | | | |
|---|---|---|---|
| 2006/0063469 | A1 | 3/2006 | Talieh et al. |
| 2006/0071299 | A1 | 4/2006 | Doyle et al. |
| 2006/0086977 | A1 | 4/2006 | Shah et al. |
| 2006/0154478 | A1 | 7/2006 | Hsu et al. |
| 2006/0172480 | A1 | 8/2006 | Wang et al. |
| 2006/0202270 | A1* | 9/2006 | Son et al. ............... 257/349 |
| 2006/0211184 | A1 | 9/2006 | Boyd et al. |
| 2006/0227595 | A1* | 10/2006 | Chuang et al. ............ 365/154 |
| 2006/0281325 | A1 | 12/2006 | Chou et al. |
| 2007/0001219 | A1 | 1/2007 | Radosavljevic et al. |
| 2007/0045748 | A1* | 3/2007 | Booth et al. ............. 257/369 |
| 2007/0048930 | A1* | 3/2007 | Figura et al. ............. 438/243 |
| 2007/0093010 | A1 | 4/2007 | Mathew et al. |
| 2007/0108514 | A1 | 5/2007 | Inoue et al. |

FOREIGN PATENT DOCUMENTS

| | | |
|---|---|---|
| EP | 0623963 | 5/1994 |
| EP | 1091413 | 4/2001 |
| EP | 1202335 | 5/2002 |
| EP | 1 566 844 | 8/2005 |
| GB | 2156149 | 10/1985 |
| JP | 56073454 | 6/1981 |
| JP | 59145538 | 8/1984 |
| JP | 2303048 | 12/1990 |
| JP | 06005856 | 1/1994 |
| JP | 06151387 | 5/1994 |
| JP | 406177089 | 6/1994 |
| JP | 2001338987 | 12/2001 |
| JP | 2002-298051 | 10/2002 |
| JP | 2003-298051 | 10/2003 |
| WO | WO-0243151 | 5/2002 |
| WO | WO-02 095814 | 11/2002 |
| WO | WO 03/003442 A1 | 1/2003 |
| WO | WO-2004059726 | 7/2004 |
| WO | WO-2005036651 | 4/2005 |

OTHER PUBLICATIONS

International Search Report and Written Opinion from PCT/US2006/037634 mailed May 31, 2007, 21 pgs.
Nackaerts, A., et al., "A 0.314 μm² 6T-SRAM Cell build with Tall Triple-Gate Devices for 45nm node applications using 0.75NA 193nm lithography," IEEE, IEDM, (2004), pp. 269-272.
Nowak, Edward J., et al., "Turning Silicon on its Edge," IEEE Circuits & Devices Magazine, Jan./Feb. 2004, pp. 20-31.
Park, Donggun, "3-dimensional nano-CMOS Transistors to Overcome Scaling Limits," IEEE, (2004), pp. 35-40.
"International Application No.:", PCT/US2006/000378, (May 24, 2006), 1-11.
"International Preliminary Report On Patentability", PCT/US2005/010505, (Oct. 12, 2006), 1-16.
"International Search Report", PCT/US2003/26242, (Jan. 26, 2004), 1-8.
"International Search Report", PCT/US2003/39727, P15677PCT, (Apr. 27, 2004), 1-6.
"International Search Report & Written Opinion", PCT/US2005/000947, (May 3, 2005), 1-14.
"International Search Report & Written Opinion", PCT/US2006/025751, (Dec. 6, 2006), 1-14.
"International Search Report & Written Opinion", PCT/US2005/035380, (Feb. 13, 2006), 1-14.
"International Search Report & Written Opinion", PCT/US2003/40320, (Jun. 2, 2004), 1-6.
"International Search Report & Written Opinion", PCT/US2005/033439, (Jan. 31, 2006), 1-7.
"International Search Report & Written Opinion", PCT/US2005/037169, (Feb. 23, 2006), 1-11.
"International Search Report & Written Opinion", PCT/US2004/032442, (Jun. 16, 2005), 1-21.
"International Search Report & Written Opinion", PCT/US2006/024516, (Jan. 17, 2007), 1-18.
"International Search Report & Written Opinion", PCT/US2006/037643, (Jan. 24, 2007), 1-14.
"International Search Report and Written Opinion", PCT/US2005/010505, (Aug. 26, 2005), 1-24.
"International Search Report and Written Opinion", PCT/US2005/020339, (Oct. 4, 2005), 1-12.
"Invitation to Pay Additional Fees", PCT/US2004/032442, (Apr. 12, 2005), 1-5.
Auth, "Vertical, Fully-Depleted, Surroundings Gate MOSFETS On sub-0.1 um Thick Silicon Pillars", 54th Annual Device Research Conference Digest, (1996), pp. 108-109.
Buchanan, D. A., et al., "Fabrication of Midgap Metal Gates Compatible With Ultrathin Dielectrics", Applied Physics Letters 73.12, (Sep. 21, 1998), pp. 1676-1678.
Burenkov, A. , "Corner effect in Double and Triple Gate FinFETs", European Solid-State Device Research 2003, 33rd Conference on. ESSDERC, (Sep. 16, 2003), pp. 135-138.
Chang, S. T., et al., "3-D Simulation of Strained S/SiGe heterojunction FinFets", Semiconductor Device Research Symposium, 2003 International Dec. 10-12, 2003, Piscataway, NJ, USA, (Dec. 2003), p. 176-177.
Chang, L. , et al., "CMOS Circuit Performance Enhancement by Surface Orientation Optimization", IEEE Transactions on Electron Devices, vol. 51, No. 10, (Oct. 2004), pp. 1621-1627.
Chau, Robert , "Advanced Metal Gate/High-K Dielectric Stacks for High-Performance CMOS Transistors", Components Research, Intel Corporation, (2004), 1-3.
Choi, Yang-Kyu , et al., "A Spacer Patterning Technology for Nanoscale CMOS", IEEE, (49)3, XP-001102694, (2002), 436-441.
Claflin, B. , et al., "Interface Studies of Tungsten Nitride And Titanium Nitride Composite Metal Gate Electrodes With Thin Dielectric Layers", Journal of Vacuum Science and Technology A 16.3, (May/Jun. 1998), pp. 1757-1761.
Fried, David M., et al., "High-Performance P-Type Independent-Gate FinFETs", IEEE 25(4):, (2004), 199-201.
Fried, David M., et al., "Improved Independent Gate N-Type FinFET Fabrication and Characterization", IEEE 24(9):, 1-3.
Guo, Jing , et al., "Performance Projections for Ballistic Carbon Nanotube Field-Effect Transistors", Applied Physics Letters 80(17):, (Apr. 29, 2002), 3192-3194.
Hisamoto, D. , "A Folded-Channel MOSFET for Deepsub-tenth Micron Era", 1998 IEEE International Electron Device Meeting Technical Digest, (1998), pp. 1032-1034.
Hisamoto, D. , "A Fully Depleted Lean-Channel Transistor (DELTA)-A Novel Vertical Ultrahin SOI MOSFET", IEEE Electron Device Letters, V. 11 (1), (1990), pp. 36-38.
Hisamoto, D. , "FinFET-A Self-Aligned Double-Gate MOSFET Scalable to 20 nm", IEEE Transactions on Electron Devices, vol. 47, No. 12, (Dec. 2000), pp. 2320-2325.
Huang, "Sub 50 nm FinFET: PMOS", 1999 IEEE International Electron Device Meeting Technical Digest, (1999), pp. 67-70.
Hwang, Jeong-Mo , et al., "Novel Polysilicon/Tin Stacked-Gate Structure for Fully-Depleted SOI/CMOS", International Electronic Devices Meeting Technical Digest, (1992), pp. 345-348.
Ieong, et al., "Three Dimensional CMOS Devices and Integrated Circuits", IEEE CICC, San Jose, CA Sep. 21-24, (2003), 207-217.
Javey, Ali , et al., "Ballistic Carbon Nanotube Field-Effect Transistors", Nature, vol. 424, (Aug. 3, 2003), 654-657.
Javey, Ali , et al., "High-k Dielectrics for Advanced Carbon-Nanotube Transistors and Logic Gates", www.nature.com/naturematerials.com, (2002), 1-8.
Jin, B. , "Mobility Enhancement in Compressively Strained Sige Surface Channel PMOS Transistors with HFO2/TIN Gate Stack", Components Research, Intel Corporation, 1-12.
Jones, E. C., et al., "Doping Challenges in Exploratory Devices for High Performance Logic", 14th Int'l Conference, Piscataway, NJ, (Sep. 22-27, 2002), 1-6.
Kim, Sung M., et al., "A Novel Multi-Channel Field Effect Transistor (McFET) on Bulk Si for High Performance Sub-80nm Application", IEEE, (2004), 1-4.
Kuo, Charles , et al., "A Capacitorless Double Gate DRAM Technology for Sub-100-nm Embedded and Stand-Alone Memory Applications", IEEE 50(12):, (2003), 2408-2416.
Kuo, Charles , et al., "A Capacitorless Double-Gate DRAM Cell Design for High Density Applications", IEEE, (2002), 843-846.

Ludwig, et al., "FinFET Technology for Future Microprocessors", 2003 IEEE Int'l. SOI Conference, New Port Beach, CA, (Sep. 29-Oct. 2, 2003), 33-34.
Martel, Richard, et al., "Carbon Nanotube Field Effect Transistors for Logic Applications", IEEE, 7.5.1-7.5.4.
Mayer, T. M., et al., "Chemical Vapor Deposition of Flouroalkylsilane Monolayer Films for Adhesion Control in Microelectromechanical Systems", J. Vac. Sci. Technol. B. 18(5):, (2000), 2433-2440.
Nowak, E. J., et al., "A Functional FinFET-DGCMOS SRAM Cell", Int'l. Electron Devices Meeting, San Francisco, CA (Dec. 8-11, 2002), 411-414.
Nowak, E. J., et al., "Scaling Beyond the 65 nm Node with FinFET-DGCMOS", IEEE CICC, San Jose, CA (Sep. 21-24, 2003), 339-342.
Ohsawa, Takashi, et al., "Memory Design Using a One-Transistor Gain Cell on SOI", *IEEE 37(11):*, (2002), 1510-1522.
Park, J., "Pi-Gate SOI MOSFET", *IEEE Electron Device Letters*, vol. 22, No. 8, (Aug. 2001), pp. 405-406.
Park, et al., "PMOS Body-Tied FinFET (Omega MOSFET) Characteristics", Device Research Conference, Piscataway, NJ, Jun. 23-25, IEEE, Jun. 2003, 33-34.
Park, Jae-Hyoun, et al., "Quantum-Wired MOSFET Photodetector Fabricated by Conventional Photolighography on SOI Substrate", *Nanotechnology, 2004, 4th IEEE Conference on Munich, Germany*, Aug. 16-19, 2004, Piscataway, NJ, pp. 425-427, XP010767302.
Seevinck, Evert, et al., "Static-Noise Margin Analysis of MOS SRAM Cells", IEEE, Journal of Solid-State Circuits, (SC-22)5, (1987), 1-7.
Stadele, M., et al., "A Comprehensive Study of Corner Effects in Tri-gate Transistors", *IEEE 2004*, pp. 165-168.
Stolk, Peter A., et al., "Modeling Statistical Dopant Fluctuations in MOS Transistors", IEEE Transactions on Electron Devices, (45)9, (1998), 1960-1971.
Subramanian, V., "A Bulk-Si-Compatible Ultrathin-body SOI Technology for Sub-100m MOSFETS", *Proceeding of the 57th Annual Device Research Conference*, (1999), pp. 28-29.
Sugizaki, T., et al., "Novel Multi-bit SONOS Type Flash Memory Using a High-k Charge Trapping Layer", *VLSI Technology, 2003, Digest of Technical Papers*. 2003 Symposium on Jun. 10-12, 2003., pp. 27-28.
Tanaka, T., et al., "Scalability Study on a Capacitorless IT-DRAM: From Single-gate PD-SOI to Double-gate FinDRAM", IEEE, (2004), 1-4.
Tokoro, Kenji, et al., "Anisotropic Etching Properties of Silicon in KOH and TMAH Solutions", Tokoro, Kenji et al., *"Anisotropic Etching Properties of Silicon on KOH and TMAH Solutions," International Symposium on Micromechatronics and Human Science, IEEE*, 1998, pp. 65-70.
Wolf, Stanley, et al., "Wet Etching Silicon", Wolf, Stanley et al., *"Wet Etching Silicon," Silicon Processing for the VLSI Era, vol. 1: Process Technology, Lattice Press*, Sunset Beach, CA, Sep. 1986, 3 pgs.
Xiong, W., et al., "Corner Effect in Multiple-Gate SOI MOSFETs", IEEE, (2003), 111-113.
Xiong, Weize, et al., "Improvement of FinFET Electrical Characteristics by Hydrogen Annealing", 25(8):, (2004), 541-543.
Yang, Fu-Liang, et al., "5nm-Gate Nanowire FinFET", IEEE, (2004), 196-197.
Yang-Kyu, Choi, et al., "Sub-20nm CMOS FinFET Technologies", IEEE, IEDM 01-421 to 1-424, (2001), 1-4.
USPTO, "Office Action" U.S. Appl. No. 10/227,068, (mailed Dec. 18, 2006), 1-25.
USPTO "Office Action" U.S. Appl. No. 10/703,316, (mailed Dec. 15, 2006), 1-22.
USPTO "Office Action" U.S. Appl. No. 11/234,014, (mailed Jun. 13, 2007), 1-8.
USPTO "Office Action" U.S. Appl. No. 11/360,269, (mailed Aug. 22, 2007) 1-12.
USPTO "Notice of Allowance," U.S. Appl. No. 11/088,035, (mailed Aug. 29, 2007) 1-3.
USPTO "Office Action" U.S. Appl. No. 11/064,996, (mailed Sep. 4, 2007), 1-16.
USPTO "Office Action" U.S. Appl. No. 11/320,467, (mailed Sep. 10, 2007) 1-18.
USPTO "Office Action" U.S. Appl. No. 11/097,429, (mailed Sep. 10, 2007) 1-17.
USPTO "Office Action" U.S. Appl. No. 11/158,661, (mailed Sep. 17, 2007) 1-42.
USPTO "Office Action" U.S. Appl. No. 11/238,447, (mailed Sep. 27, 2007) 1-9.
USPTO "Office Action" U.S. Appl. No. 11/335,103, (mailed Oct. 31, 2007) 1-12.
USPTO "Office Action" U.S. Appl. No. 11/322,795, (mailed Jan. 2, 2008) 1-10.
USPTO "Office Action" U.S. Appl. No. 11/332,189, (mailed Jan. 11, 2008) 1-5.
European Patent Office "Office Action" Application No. 03788707.2-1528, (mailed Jul. 26, 2007) 1-4.
UK Intellectual Property Office, "Examination Report" Application No. GB0714637.6, (mailed Sep. 10, 2007) 1-2.
PCT, "International Preliminary Report on Patentability", *PCT/US/2006/037634*, mailed Apr. 10, 2008, pp. 1-11.
USPTO "Office Action"U.S. Appl. No. 11/080,765, (mailed May 2, 2007) pp. 1-21.
USPTO "Final Office Action" U.S. Appl. No. 11/080,765, (mailed Nov. 13, 2007), pp. 1-13.
USPTO "Office Action" U.S. Appl. No. 11/097,429, (mailed Feb. 21, 2008) pp. 1-12.
USPTO "Final Office Action" U.S. Appl. No. 11/158,661, (mailed Jan. 15, 2008) pp. 1-25.
USPTO "Final Office Action" U.S. Appl. No. 11/064,996, (mailed Mar. 14, 2008) pp. 1-13.
USPTO "Office Action"U.S. Appl. No. 11/297,084, (mailed Mar. 17, 2008) pp. 1-6.
USPTO "Office Action" U.S. Appl. No. 11/154,138, (mailed Mar. 18, 2008) pp. 1-17.
USPTO "Office Action" U.S. Appl. No. 11/240,487 (mailed Mar. 27, 2008) pp. 1-10.
USPTO "Office Action" U.S. Appl. No. 10/973,228, (mailed May 6, 2008) pp. 1-8.
USPTO "Office Action" U.S. Appl. No. 11/080,765, (mailed May 12, 2008) pp. 1-11.
USPTO "Office Action" U.S. Appl. No. 11/986,510, (mailed May 12, 2008) pp. 1-9.
Korean Patent Office "Office Action" with Translation, Application No. 10-2007-7007396, (mailed Mar. 28, 2008) pp. 1-8.

* cited by examiner

PROCESS FOR INTEGRATING PLANAR AND NON-PLANAR CMOS TRANSISTORS ON A BULK SUBSTRATE AND ARTICLE MADE THEREBY

BACKGROUND OF THE INVENTION

1. Field of the Invention

The present invention relates to the field of semiconductor integrated circuit manufacturing, and more particularly to methods of integrating non-planar transistors with variable channel widths into a bulk semiconductor CMOS process.

2. Discussion of Related Art

Figure 1A:
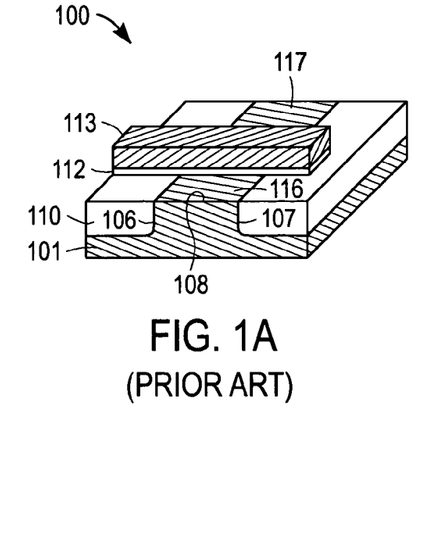
FIGS. 1A, 1B, and 1C are illustrations of a perspective view of a conventional planar, single-gate transistor on a bulk semiconductor substrate and a conventional non-planar, multi-gate transistor on an SOI substrate, respectively.

For decades, planar transistors have been fabricated on bulk semiconductor substrates. Transistor 100, as shown in FIG. 1A, is such a planar device. An active region, having opposite sidewalls 106 and 107, and a top surface 108, is formed between isolation regions 110 on bulk semiconductor substrate 101. The isolation regions 110 substantially cover the opposite sidewalls 106 and 107. The top semiconductor surface 108 is apportioned into, a source region 116, a drain region 117, and a channel region covered by a gate insulator 112 and a gate electrode 113. In the planar transistor design, the device is typically controlled or gated via the capacitive coupling between the top semiconductor surface 108 and the gate electrode 113. Because the channel is gated by a single gate electrode-semiconductor interface, the planar transistor is frequently called a single-gate device.

Figure 1B:
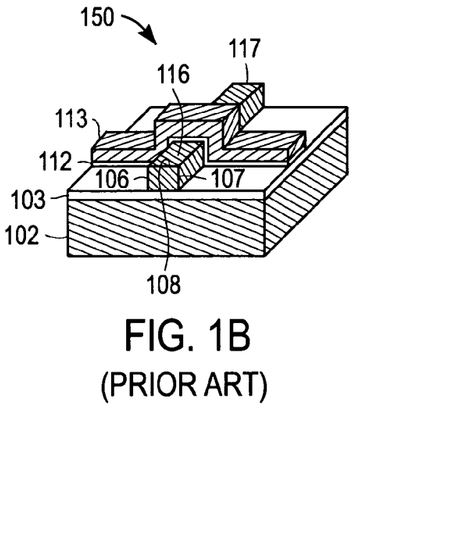

More recently, non-planar transistors have been under development to address the short channel effect (SCE) afflicting planar nano-scale transistors. A non-planar transistor is a transistor where the semiconductor channel is non-planar and the gate electrode couples to the channel through more than one surface plane, typically through sidewall portions formed by the non-planarity. Transistor 150, as shown in FIG. 1B, is such a non-planar device. An active semiconductor region, having opposite sidewalls 106 and 107, and a top surface 108, is formed over a substrate comprised of an isolation region 103 on a carrier 102. The top surface 108 and the opposite sidewalls 106 and 107 are apportioned into a source region 116, and a drain region 117, and a channel region covered by a gate insulator 112 and a gate electrode 113. In this transistor design, the device can be gated by the opposite sidewalls 106 and 107, as well as the top surface 108 of the device, reducing the SCE. Because the channel is gated by multiple gate electrode-semiconductor interfaces, the non-planar transistor is frequently called a multi-gate device.

Figure 1C:
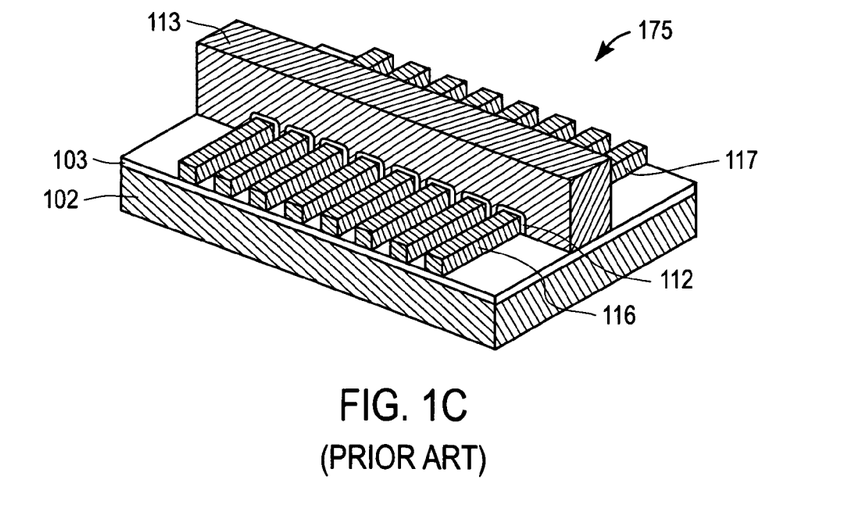

Non-planar, or multi-gate, devices have been typically been formed upon substrates comprising an insulating layer, commonly called semiconductor-on-insulator (SOI). While there are many advantages to non-planar devices formed on SOI, there are also many disadvantages. For example, the channel width of a non-planar transistor on SOI is limited by the final thickness of the active silicon layer formed on the insulator layer of the SOI substrate. Thus, circuit designers are limited to a fundamental width and multiples of that width for all transistors of a circuit formed on the substrate. As shown in FIG. 1C, multiple non-planar bodies, each having a source 116 and drain 117 region are coupled by a common gate electrode 113 through a gate insulator 112 in an electrically parallel fashion to form device 175. Device 175 limits circuit design flexibility because the current carrying width must be incremented discretely, not continuously. Also, because of lithographic pitch limitations, non-planar transistors like device 175 shown in FIG. 1C incur a layout penalty relative to traditional planar transistors. Another disadvantage of devices formed on SOI is the commonly known "floating body" effect due to the buried insulator layer, which results in the loss of a ground plane for the transistors. Furthermore, non-planar transistors formed on SOI substrates suffer from poorer thermal conductivity and a higher overall cost than devices formed on bulk substrates.

DETAILED DESCRIPTION OF THE PRESENT INVENTION

A novel CMOS device structure and its method of fabrication are described. In the following description, numerous specific details are set forth, such as specific materials, dimensions and processes, etc. in order to provide a thorough understanding of the present invention. In other instances, well-known semiconductor processes and manufacturing techniques have not been described in particular detail in order to not unnecessarily obscure the present invention.

Figure 2:
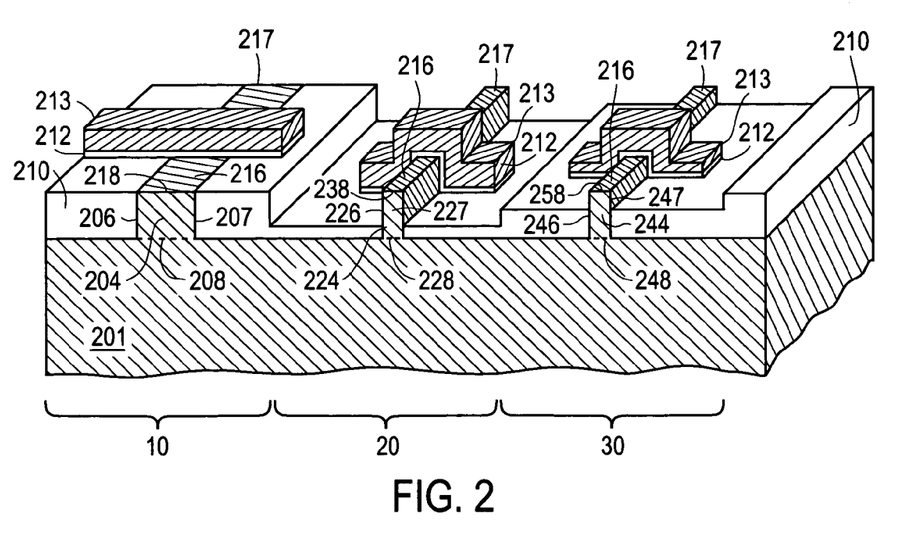
FIG. 2 is an illustration of a perspective view of a circuit device having a planar transistor and non-planar transistors in accordance with an embodiment of the present invention.

In accordance with an embodiment of the present invention, as illustrated in FIG. 2, three transistors, a planar device 10, a non-planar device 20 having a first channel width and a non-planar device 30 having a second channel are formed on a single "bulk semiconductor" substrate 201. Transistors 10, 20, and 30 are each coupled to the semiconductor substrate (preventing the floating-body effect) and both planar and non-planar transistor designs have a channel width that can be independently defined to be any value (rather than merely discrete values). By utilizing a method enabling the non-planar transistors 20 and 30 to have various sidewall heights, various channel widths can be specified and the performance requirements of individual portions of a single device can be individually satisfied with any combination of planar transistors (having baseline SCE) and non-planar transistors (having reduced SCE). In a specific embodiment of the present invention, a microprocessor core, comprising logic regions, is made up of planar transistors, while a microprocessor cache, comprising memory, such as SRAM, is made up of non-planar transistors. In another particular embodiment of the present invention, a portion of a circuit, such as a driver, requiring a large total current is made up of planar transistors having a larger current carrying channel width than the non-planar transistors used in other portions of the circuit.

Embodiments of the non-planar transistor of the present invention include, but are not limited to, dual-gate, FinFET, tri-gate, pi-gate or omega-gate designs. In some embodiments, all non-planar transistors are a "tri-gate" design having a top gate, while in other embodiments all non-planar transistors are a "dual-gate" design having only sidewall gates.

Substrate 201 is comprised of a "bulk semiconductor", such as, but not limited to, a monocrystalline silicon substrate or a gallium arsenide substrate. In a further embodiment of the present invention the substrate 201 is a bulk silicon semiconductor having a doped epitaxial silicon layer with either p-type or n-type conductivity at an impurity concentration level between $1\times10^{16}$-$1\times10^{19}$ atoms/cm$^3$. In another embodiment of the present invention, the substrate 201 is a bulk silicon semiconductor substrate having an undoped, or intrinsic epitaxial silicon layer. In a "bulk semiconductor" substrate, unlike a silicon-on-insulator (SOI) substrate, there is no "buried" insulating layer between semiconductor portion used to fabricate the active devices and the semiconductor portion used for handling.

Transistors 10, 20 and 30, as shown in FIG. 2, are comprised of active regions 204, 224 and 244 on the bulk semiconductor substrate. The distance between the isolation regions 210 defines an individual transistor active area width. The active regions 204, 224, 244 have top surfaces, 218, 238, 258 and bottom planes 208, 228, 248, respectively. The bottom planes 208, 228 and 248 are defined to be substantially level with the bottom surface of isolation regions 210, as shown in FIG. 2. For simplicity, semiconductor active regions of FIG. 2 are referred to as "on" the substrate, wherein the substrate is the semiconductor portion below the reference planes 208, 228, and 248. However, the active regions could also be considered "in" the substrate if a different reference plane is chosen. The portion of the active region sidewalls exposed to the gate insulator and control gate electrode is referred as the "gate-coupled sidewall." As shown in FIG. 2, the isolation regions 210 substantially cover the sidewalls 206 and 207 of the active region 204 of transistor 10. Therefore, the planar, single-gate transistor 10 does not have gate-coupled sidewalls because the distance between the top surface 218 and the bottom plane 208 is roughly equal to the thickness of the bordering isolation regions 210. As such, the active region of transistor 10 has primarily only the top surface 218 coupled to the control gate 213 and the channel width is equal to the width of the top surface 218. For non-planar device 20 however, the portion of the pair sidewalls 226 and 227 extending above the top surface of the adjacent isolation regions 210 is "gate-coupled" and this portion contributes to the total channel width of device 20. As shown in FIG. 2, the "gate-coupled sidewall" height of transistor 20 is equal to the distance between the top surface 238 and the bottom plane 228 minus the thickness of the adjacent isolation regions 210. In an embodiment of the present invention, the height of the gate-coupled sidewalls is substantially equal to the width of the active area top surface 258, as shown in transistor 30 of FIG. 2. In another embodiment of the present invention, the gate-coupled sidewall height of the non-planar transistors is between half the active area width and twice the active area width. In a particular embodiment of the present invention, the non-planar transistors have an active area width and gate-coupled sidewall height less than 30 nanometers, and more particularly, less than 20 nanometers.

The current carrying width of a non-planar transistor in accordance with an embodiment of the present invention can be continuously and individually set to virtually any desired value by varying the height of the gate-coupled sidewall. As pictured in FIG. 2, sidewalls 226 and 227 of transistor 20 have a first gate-coupled sidewall height and sidewalls 246 and 247 of transistor 30 have a second, different gate-coupled sidewall height. Therefore, transistor 20 has a first current carrying channel width and transistor 30 has a second, different, current carrying channel width. Because the current carrying channel width of a non-planar transistor increases as the gate-coupled sidewall height increases, in the embodiment shown in FIG. 2, transistor 20 has a greater channel width than transistor 30. Thus, embodiments of the present invention have non-planar transistors with continuously variable channel widths and thereby provide circuit design flexibility previously unavailable to non-planar transistors.

In embodiments of the present invention no layout efficiency penalty is incurred for non-planar transistors having a channel width greater than a minimum width. Layout efficiency is a ratio of the absolute current carrying width of a non-planar device layout over that of the typical planar device occupying the same layout width. In embodiments of the present invention, the gate-coupled sidewall height of a single non-planar transistor is scaled to provide a desired total current carrying width. Thus, scaling the current carrying width does not rely on incrementing the number of parallel non-planar devices having a discrete channel width. Because the channel width increases with sidewall height rather than top surface area, no additional layout width is required to increase the channel width of a non-planar transistor fabricated in accordance with particular embodiments of the present invention. As such, these particular embodiments improve the packing density of the devices and can have layout efficiencies greater than unity.

As shown in FIG. 2, transistors 10, 20, and 30 have a gate insulator layer 212. In the depicted non-planar embodiments, gate insulator 212 surrounds the active regions, in contact with the exposed semiconductor surfaces. In such embodiments, gate dielectric layer 212 is in contact with the sidewalls as well as the top surfaces of the active regions of transistors 20 and 30, as shown in FIG. 2. In other embodiments, such as in particular FinFET or dual-gate designs, the gate dielectric layer is only in contact with the sidewalls of the active regions, and not the top surfaces 238 and 258 of the non-planar devices. In planar transistor embodiments, such as transistor 10 in FIG. 2, the gate insulator is formed only on the top surface 218. Gate insulator 212 can be of any commonly known dielectric material compatible with the semiconductor surface and the gate electrode 213. In an embodiment of the present invention, the gate dielectric layer is a silicon dioxide ($SiO_2$), silicon oxynitride ($SiO_xN_y$) or a silicon nitride ($Si_3N_4$) dielectric layer. In one particular embodiment of the present invention, the gate dielectric layer 212 is a silicon oxynitride film formed to a thickness of between 5-20 Å. In another embodiment of the present invention, gate dielectric layer 212 is a high K gate dielectric layer, such as a metal oxide dielectric, such as but not limited to tantalum oxide, titanium oxide, hafnium oxide, zirconium oxide, and aluminum oxide. Gate dielectric layer 212 can be other types of high K dielectric, such as, but not limited to, lead zirconium titanate (PZT).

The transistors 10, 20, and 30 have a gate electrode 213, as shown in FIG. 2. In certain embodiments, gate electrode 213 is in contact with gate dielectric layer 212 formed on sidewalls of each of the non-planar transistors 20 and 30. In planar embodiments, such as transistor 10, the gate electrode 213 is in contact with the gate dielectric layer over the top surface 218. Gate electrode 213 has a pair of laterally opposite sidewalls separated by a distance, defining the gate length ($L_g$) of transistor 10, 20, and 30. In an embodiment of the present invention, $L_g$ of planar transistor 10 and non-planar transistors 20 and 30 are between about 20 nm and about 30 nm. Gate electrode 213 has an effective width equal to the current carrying width of the semiconductor channel controlled by gate electrode 213. In an embodiment of the present invention, effective current carrying width of a non-planar device is greater than the effective width of the planar device. In a particular embodiment, as shown in FIG. 2, the gate-coupled sidewall height of each the sidewalls 226 and 227 is greater than the width of the top surface 218. In this manner, the effective gate electrode width of transistor 20 is greater than the effective gate electrode width of transistor 10. In another embodiment, the effective width of the gate electrode of transistor 10 is greater than that of transistor 20. In still another embodiment of the present invention, the gate electrode physically connects, or is continuous between, a planar device and a non-planar device, multiple planar devices, or multiple non-planar devices.

Gate electrode 213 of FIG. 2 can be formed of any suitable gate electrode material having the appropriate work function. In an embodiment of the present invention, the gate electrode is comprised of polycrystalline silicon. In another embodiment, the gate electrode is comprised of a metal, such as tungsten, tantalum nitride, titanium nitride or titanium silicide, nickel silicide, or cobalt silicide. It should also be appreciated that the gate electrode 213 need not necessarily be a single material, but rather can also be a composite stack of thin films such as a metal/polycrystalline silicon electrode.

Transistors 10, 20 and 30, as shown in FIG. 2, each have source regions 216 and drain regions 217. Source regions 216 and drain regions 217 are formed in the active regions on opposite sides of gate electrode 213. The source region 216 and the drain region 217 are formed of the same conductivity type, such as n-type or p-type conductivity, depending on the transistor being an nMOS device or a pMOS device. In an embodiment of the present invention, source region 216 and drain region 217 have a doping concentration of $1\times10^{19}$-$1\times10^{21}$ atoms/cm$^3$. Source region 216 and drain region 217 can be formed of uniform concentration or can include subregions of different concentrations or doping profiles such as tip regions (e.g., source/drain extensions).

As shown in FIG. 2, transistors 10, 20, and 30 each have a channel region below the gate electrode 213 in the active area located between source regions 216 and drain regions 217. The channel regions of transistors 10, 20, and 30 can be independently doped to an impurity level appropriate for the particular device geometry, gate stack, and performance requirements. When the channel region is doped, it is typically doped to the opposite conductivity type of the source region 216 and the drain region 217. For example, the nMOS device 205 has source and drain regions which are n-type conductivity while the channel region is doped to p-type conductivity. In certain embodiments of the present invention, the channel regions of the non-planar devices 20 and 30 are intrinsic or undoped while the channel region of the planar devices is doped. In an embodiment of the present invention, the channel regions of transistors 10, 20 30 are all doped. When a channel region is doped, it can be doped to a conductivity level of $1\times10^{16}$-$1\times10^{19}$ atoms/cm$^3$.

A method of fabricating a CMOS device on a bulk substrate in accordance with an embodiment of the present invention as shown in FIG. 2 is illustrated in FIGS. 3A-3G. In a particular embodiment, the fabrication begins with a "bulk" silicon monocrystalline substrate 201. In certain embodiments of the present invention, the substrate 201 is a silicon semiconductor having a doped epitaxial region with either p-type or n-type conductivity with an impurity concentration level of $1\times10^{16}$-$1\times10^{19}$ atoms/cm$^3$. In another embodiment of the present invention the substrate 201 is a silicon semiconductor having an undoped, or intrinsic epitaxial silicon region. In other embodiments, the bulk substrate 201 is any other well-known semiconductor material, such as gallium arsenide (GaAs), indium antimonide (InSb), gallium antimonide (GaSb), gallium phosphide (GaP), indium phosphide (InP), or carbon nanotubes (CNT).

Figure 3A:
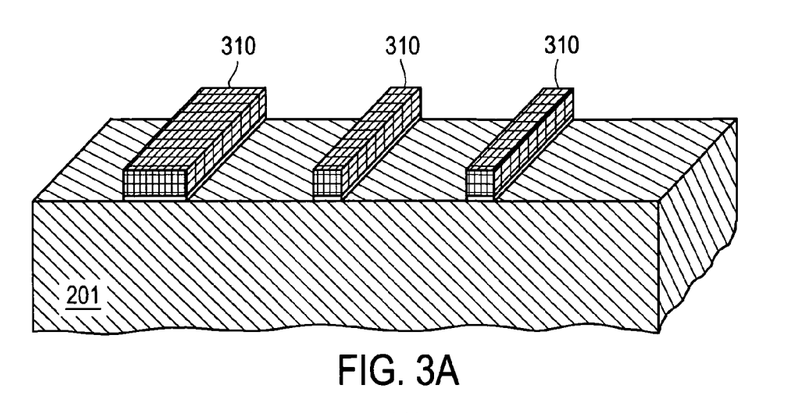
FIGS. 3A-3G are illustrations of perspective views of a method of fabricating a device with both planar and non-planar transistors in accordance with an embodiment of the present invention.

A mask is used to define the active regions of the transistors. The mask can be any well-known material suitable for defining the semiconductor substrate. As shown in FIG. 3A, in an embodiment of the present invention, mask 310 is formed of a dielectric material that has been lithographically defined and etched. In another embodiment, mask 310 is itself a photo-definable material. In a particular embodiment, as shown in FIG. 3A, masking layer 310 can be a composite stack of materials, such as an oxide/nitride stack. If masking layer 310 is a dielectric material, commonly known techniques, such as chemical vapor deposition (CVD), low pressure chemical vapor deposition (LPCVD), plasma enhanced chemical vapor deposition (PECVD), or even spin on processes may be used to deposit the mask material while commonly known lithography and etching process may be used to define the mask. In an embodiment of the present invention, the minimum lithographic dimension is used to define the width of the mask 310. In another embodiment, the minimum width of the mask 310 is sub-lithographic, formed by commonly known techniques such as dry develop, oxidation/strip, or spacer-based processes. In a particular embodiment of the present invention, the width of mask 310 is less than 30 nanometers, and more particularly, less than 20 nanometers.

Figure 3B:
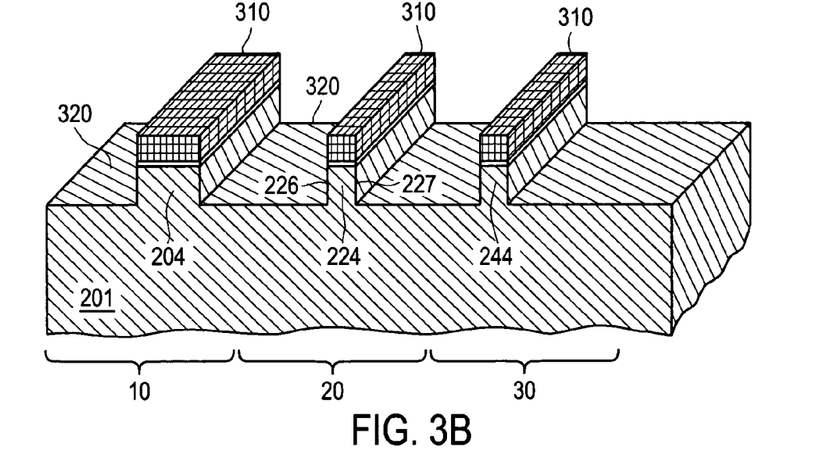

As shown in FIG. 3B, once masking layer 310 has been defined, a portion of the semiconductor on bulk substrate 201 is etched using commonly known methods to form recesses or trenches 320 on the substrate in alignment with mask 310. The isolation etch defining the active regions has sufficient depth to isolate individual devices from one another and form a gate-coupled sidewall of adequate height to achieve the maximum desired channel width of the non-planar transistors. In a particular embodiment of the present invention, trenches 320 are etched to a depth equal to the maximum desired non-planar transistor channel width plus about 100 Å to about 500 Å to accommodate a dielectric isolation region. In still another embodiment, the trenches 320 are etched to a depth of approximately 1500 Å to 3000 Å.

Figure 3C:
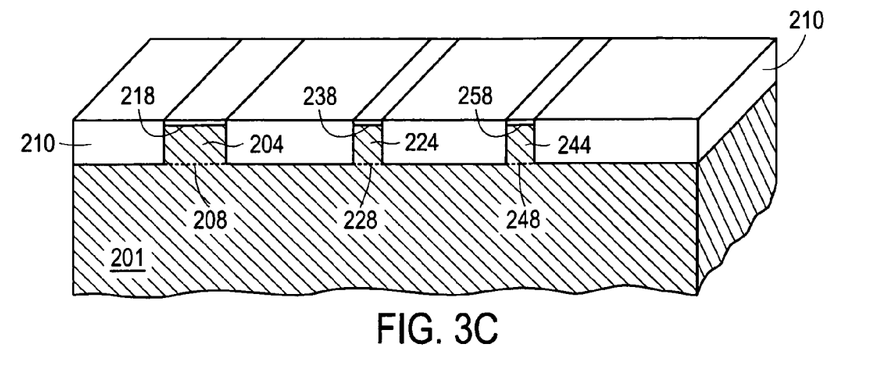

As shown in FIG. 3C, the trenches 320 are then filled with a dielectric to form shallow trench isolation (STI) regions 210 on substrate 201. In an embodiment of the present invention, a liner of oxide or nitride on the bottom and sidewalls of the trenches 320 is formed by commonly known methods, such as thermal oxidation or nitridation. Next, the trenches 320 are filled by blanket depositing an oxide over the liner by, for example, a high-density plasma (HDP) chemical vapor deposition process. The deposition process will also form dielectric on the top surfaces of the mask 310. The fill dielectric layer can then be removed from the top of mask 310 by chemical, mechanical, or electrochemical, polishing techniques. The polishing is continued until the mask 310 is revealed, forming isolation regions 210, as shown in FIG. 3C. In a particular embodiment of the present invention, commonly known methods are used to selectively remove the mask 310. In another embodiment, as shown in FIG. 3C, a portion of mask 310 is retained.

If desired, wells can then be selectively formed for pMOS and nMOS transistors. Wells can be formed using any commonly known technique to dope the active regions to a desired impurity concentration. In embodiments of the present invention, active regions 204, 224, and 244 are selectively doped to p-type or n-type conductivity with a concentration level of about $1\times10^{16}$-$1\times10^{19}$ atoms/cm$^3$ using commonly known masking and ion implantation techniques. In a particular embodiment, the well regions extend into the semiconductor about 500 Å deeper than the bottom planes 208, 228 and 248 of the active regions, shown in FIG. 3C. In embodiments of the present invention, after the selective well implant and mask strip, a commonly known clean, such as HF, removes either the mask 310 or native oxides from the active region top surfaces 218, 238 and 258. In a further embodiment of the present invention, commonly known techniques are then used to either grow or deposit a sacrificial oxide over the top surfaces 218, 238 and 258.

Figure 3D:
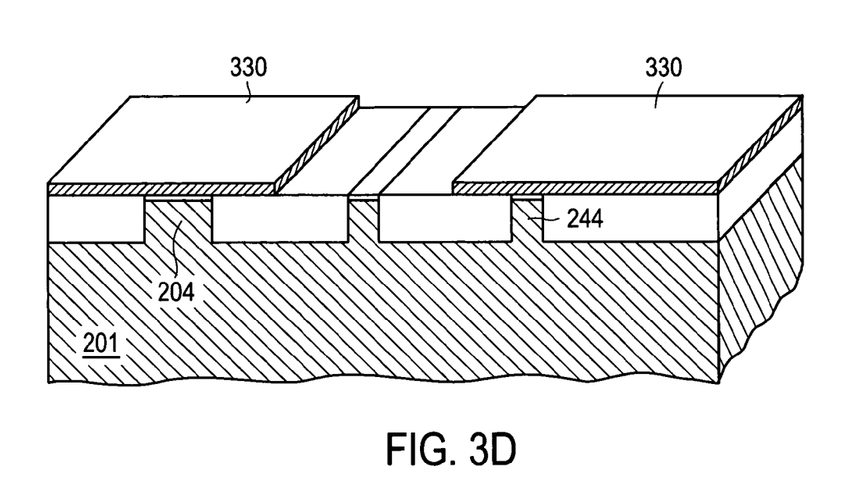

The isolation regions can then be selectively protected with a masking material to allow selective definition of the non-planar devices. In an embodiment, as shown in FIG. 3D, mask 330 is formed in a manner similar to that described above with reference to FIG. 3A. Mask 330 can be either a photo-definable material or a commonly known "hard" mask material that was patterned with common lithography and etch techniques. In the embodiment depicted in FIG. 3D, mask 330 is a photo-definable material, a photo resist. As shown in FIG. 3D, mask 330 is used to protect isolation regions 210 bordering the active region 204 of planar device 10 and active region 224. If desired, additional mask layers may be utilized to selectively protect various other isolation regions.

Figure 3E:
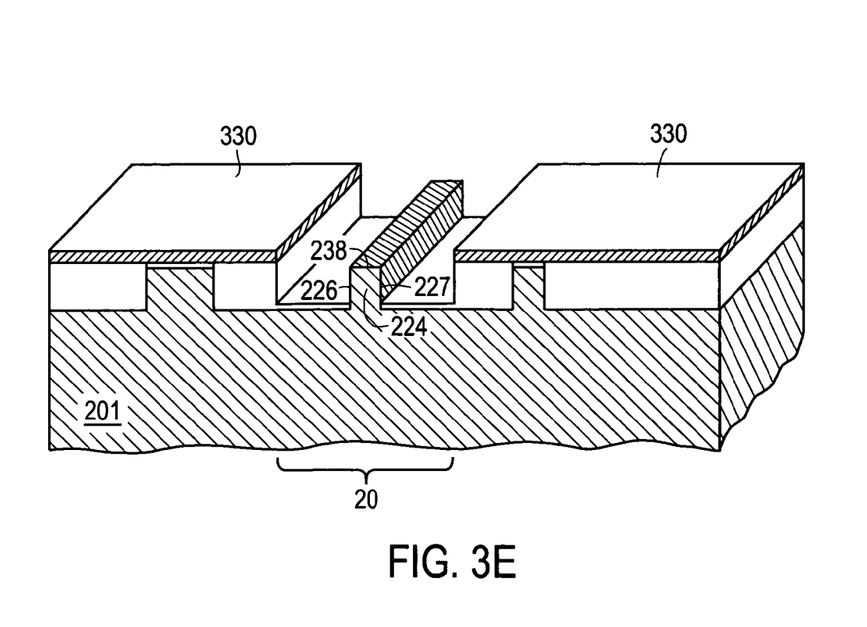

Next, the isolation regions not protected by a mask are etched back, or recessed, to expose the sidewalls of the active area of the non-planar transistors. As shown in FIG. 3E, isolation regions 210 not protected by mask 330 are etched back without significantly etching the semiconductor active area 224, exposing at least a portion of semiconductor sidewalls 226 and 227. In embodiments where semiconductor active areas are silicon, isolation regions 210 can be recessed with an etchant comprising a fluorine ion, such as HF. In some embodiments, isolation regions 210 are recessed using a commonly known anisotropic etch, such as a plasma or RIE process using an etchant gas such as, but not limited to, C2F6. In a further embodiment, an anisotropic etch can be followed by an isotropic etch, such as a commonly known dry process using a gas such as NF3, or a commonly known wet process such as HF, to completely remove the isolation dielectric from at least a portion of the semiconductor active region sidewalls. In some embodiments, only a portion of the unprotected isolation regions is removed during the recess etch. In a particular embodiment (not pictured), the recess etch is selective to the isolation liner material over the isolation fill material, such that the isolation recess etch is deeper along the liner region immediately adjacent to the active region than in the isolation fill region. In this manner, the width of the recess etch can then be very tightly controlled by the width of the liner, enabling a high transistor packing density.

The isolation regions are selectively recessed by an amount which, when added to a subsequent amount of unselective, or blanket recess etching, achieves the desired final gate-coupled sidewall height for the designed non-planar transistor channel width. A transistor's final gate-coupled sidewall height is determined by the cumulative amount, or depth, the adjacent isolation region is recessed. The isolation recess depth is limited by the demands of device isolation and moderate aspect ratios. For example, subsequent processing can result in inadvertent spacer artifacts if the isolation recess produces aspects ratios that are too aggressive. In a particular embodiment of the present invention, a portion of the isolation region is recessed so that the final isolation thickness is about 200 Å to about 300 Å. In other embodiments, the final isolation thickness is significantly more than about 300 Å. In an embodiment of the present invention, isolation regions 210 are recessed by approximately the same amount as the width dimension of the top surface 238 of the semiconductor active region 224. In other embodiments, the isolation regions 210 are recessed by a significantly larger amount than the width dimension of the top surface 238.

Figure 3F:
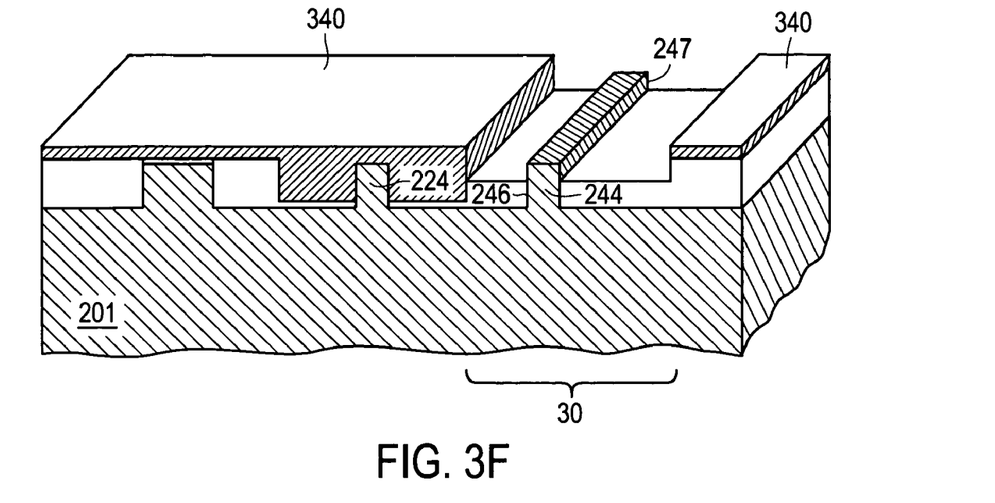

In an embodiment of the present invention, as shown in FIG. 3F, the mask 330 is then removed by commonly known means and a second mask 340 is formed in a fashion similar as that previously discussed in reference to FIG. 3D. Mask 340 protects the active region 224 while the isolation regions 210 surrounding active region 244 are recessed as described above in reference to FIG. 3E. In this embodiment, a different sidewall height can be achieved for 244 than that of 224, thereby forming a non-planar transistor 30 having a different channel width than non-planar transistor 20. It should be appreciated that the process of selectively masking a portion of the isolation regions and recess etching the isolation regions by a specific amount can be repeated a number of times and in a number of ways to achieve a menu of gate-coupled sidewall heights, corresponding to a menu of non-planar transistor channel widths, in accordance with the present invention.

Once the selective isolation recess etches are completed, all isolation masks are removed with commonly known techniques. If desired, a final clean, such as HF, may then be performed on all active regions, further recessing all isolation regions. In a particular embodiment of the present invention, additional sacrificial oxidation and blanket oxide etches or cleans are performed to both improve the semiconductor surface quality and further tailor the shape of the active regions through corner rounding, feature shrinking, etc.

Figure 3G:
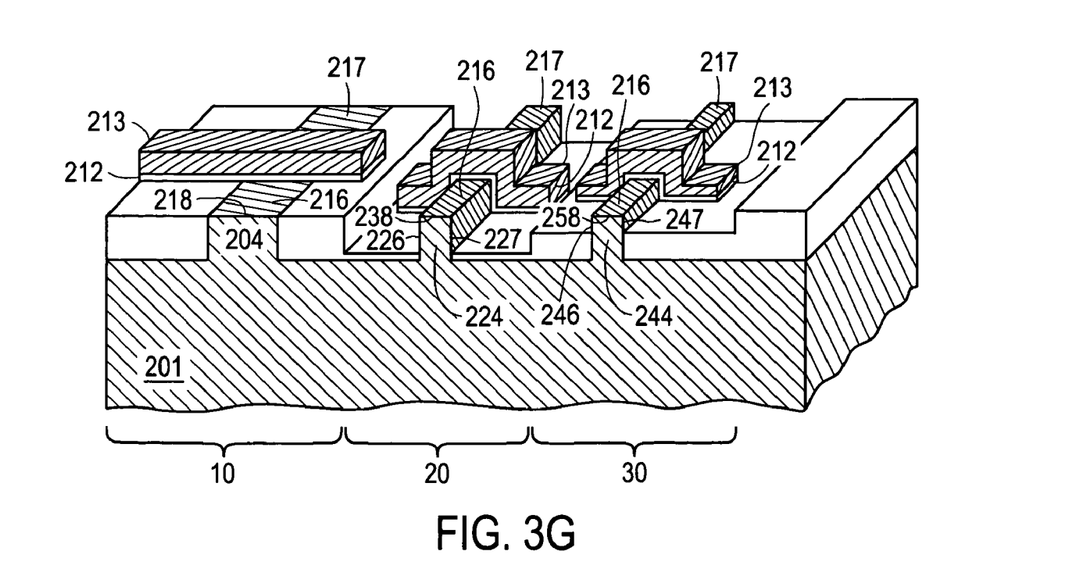

A gate dielectric can then be formed over the active regions in a manner dependent on the type of non-planar device (dual-gate, tri-gate, etc.). In a tri-gate embodiment of the present invention, as shown in FIG. 3G, a gate dielectric layer 212 is formed on the top surface of each of the active regions 204, 224 and 224, as well as on, or adjacent to, the exposed sidewalls 226, 227 and 246, 247 of the non-planar devices. In certain embodiments, such as dual-gate embodiments, the gate dielectric is not formed on the top surfaces of the non-planar active regions. The gate dielectric can be a deposited dielectric or a grown dielectric. In an embodiment of the present invention, the gate dielectric layer 212 is a silicon dioxide dielectric film grown with a dry/wet oxidation process. In an embodiment of the present invention, the gate dielectric film 212 is a deposited high dielectric constant (high-K) metal oxide dielectric, such as tantalum pentaoxide, titanium oxide, hafnium oxide, zirconium oxide, aluminum oxide, or another high-K dielectric, such as barium strontium titanate (BST). A high-K film can be formed by well-known techniques, such as chemical vapor deposition (CVD) and atomic layer deposition (ALD).

A gate electrode is then formed over each active region. In an embodiment of the present invention, the gate electrode 213, as shown in FIG. 3G, is formed on the gate dielectric layer 212 over the top surfaces 218, 238, 258 and is formed on or adjacent to the gate dielectric 212 along the sidewalls 226, 227 and 246, 247. The gate electrode can be formed to a thickness between 200-3000 Å. In particular embodiments, the thickness of the gate electrode material is constrained by the depth of the isolation region recess etch because the gate electrode material will tend to form a conductive spacer along the topography generated by the recess etch. For such embodiments, over-etching of the gate electrode material can prevent such spacer artifacts if the isolation recess depth is less than the thickness of the gate electrode material. In an embodiment, the gate electrode has a thickness of at least three times the gate-coupled sidewall height (previously defined as the exposed portion of the active area sidewall). In an embodiment of the present invention, the gate electrode is comprised of polycrystalline silicon. In some embodiments of the present invention, the gate material is metal such as, but not limited to, tungsten, tantalum nitride, titanium nitride or titanium silicide, nickel silicide, or cobalt silicide. In still other embodiments, the electrode is formed from a composite of poly-silicon and metal. In an embodiment of the present invention, gate electrode 213 is formed by well-known techniques, such as blanket depositing a gate electrode material over the substrate and then patterning the gate electrode material. In other embodiments of the present invention, the gate electrode is formed using "replacement gate" methods. In such embodiments, the gate electrode utilizes a fill and polish technique similar to those commonly employed in damascene metallization technology, whereby the recessed isolation regions may be completely filled with gate electrode material.

In an embodiment of the present invention, source regions 216 and drain regions 217 for transistors 10, 20, and 30 are formed in the active regions on opposite sides of gate electrode 213, as shown in FIG. 3G. For a pMOS transistor, the active region is doped to p-type conductivity and to a concentration of $1\times10^{19}$-$1\times10^{21}$ atoms/cm$^3$. For an nMOS transistor, the active is doped with n-type conductivity ions to a concentration of $1\times10^{19}$-$1\times10^{21}$ atoms/cm$^3$. At this point the CMOS transistor of the present invention is substantially complete and only device interconnection remains.

Although the invention has been described in language specific to structural features and/or methodological acts, it is to be understood that the invention defined in the appended claims is not necessarily limited to the specific features or acts described. Rather, the specific features and acts are disclosed as particularly graceful implementations of the claimed invention.

We claim:

1. A method of forming a microprocessor including both a planar logic transistor and non-planar SRAM transistors of differing channel width, the method comprising:

forming a logic active region of a bulk semiconductor substrate, the logic active region having sidewalls adjacent to a logic trench isolation region of the bulk semiconductor substrate;

forming a first SRAM active region of the bulk semiconductor substrate, the first SRAM active region having sidewalls adjacent to a first SRAM trench isolation region of the bulk semiconductor substrate;

forming a second SRAM active region of the bulk semiconductor substrate, the second SRAM active region having sidewalls adjacent to a second SRAM trench isolation region of the bulk semiconductor substrate;

recessing a top surface of the first SRAM trench isolation region by a first amount to expose at least a portion of the first SRAM active region sidewall;

recessing a top surface of the second SRAM trench isolation region by a second amount to expose at least a portion of the second SRAM active region sidewall, the second amount of recess being different than the first amount of recess;

forming a first gate insulator adjacent to at least a portion of the first SRAM active region sidewall and forming a second gate insulator adjacent to at least a portion of the second SRAM active region sidewall; and forming a third gate insulator only on the top surface of the logic active region;

forming a first, second and third gate electrode adjacent to the first, second and third gate insulators, respectively; and forming a pair of source/drain regions on opposite sides of the first, second and third gate electrodes, respectively, to form the planar logic transistor and a first and second non-planar SRAM transistor of differing channel widths.

2. The method of claim 1, further comprising:

forming, in at least one of the non-planar SRAM transistors, a doped channel region; and forming, in the logic active region, an undoped channel region.

* * * * *